US 7,184,729 B2

(12) United States Patent
Kluge et al.

(10) Patent No.: US 7,184,729 B2
(45) Date of Patent: Feb. 27, 2007

(54) DIGITAL AUTOMATIC GAIN CONTROL FOR TRANSCEIVER DEVICES

(75) Inventors: Wolfram Kluge, Dresden (DE); Lutz Dathe, Dresden (DE); Dietmar Eggert, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 676 days.

(21) Appl. No.: 10/259,708

(22) Filed: Sep. 27, 2002

(65) Prior Publication Data
US 2003/0203726 A1    Oct. 30, 2003

(30) Foreign Application Priority Data
Apr. 30, 2002  (DE) .................... 102 19 364

(51) Int. Cl.
*H04B 7/00*  (2006.01)
*H04B 7/16*  (2006.01)
(52) U.S. Cl. .................. 455/234.1; 455/67.11; 455/115.1; 455/240.1; 455/277.2
(58) Field of Classification Search .......... 455/234.1, 455/236.1, 240.1, 245.1, 255, 257, 259, 260, 455/277.2, 293, 339, 341, 67.4, 115.1
See application file for complete search history.

(56) References Cited

U.S. PATENT DOCUMENTS 5,627,857 A * 5/1997 Wilson .................. 375/219
5,635,864 A * 6/1997 Jones .................... 327/77
5,684,486 A * 11/1997 Ono et al. ............... 341/159
5,917,865 A    6/1999 Kopmeiners et al.
6,563,891 B1 * 5/2003 Eriksson et al. ........... 375/345
6,654,594 B1 * 11/2003 Hughes et al. ........... 455/245.1
6,668,164 B2 * 12/2003 Hughes .................. 455/234.1
2003/0153289 A1 * 8/2003 Hughes et al. ........... 455/138

FOREIGN PATENT DOCUMENTS

EP    0859462    9/1996

OTHER PUBLICATIONS

"A Zero-IF Single-Chip Transceiver for Up to 22Mb/s QPSK 802.11b Wireless LAN", Stroet, et al, *2001 IEEE International Solid-State Cirucits Conference*, IEEE, San Francisco, CA, Feb. 2001.

(Continued)

*Primary Examiner*—Tony T. Nguyen
(74) *Attorney, Agent, or Firm*—Meyertons Hood Kivlin Kowert & Goetzel, P.C.; B Noël Kivlin

(57) ABSTRACT

An automatic gain controller for transceiver elements uses a digital topology to achieve an efficient and rapid gain settling so that an output signal of the variable gain section is within a predefined range. In one embodiment, an input signal is periodically sampled and latched so as represent the gain excess of a variable gain section. An accumulator, including an adder having saturation characteristics and a latch as a feedback element, creates a number for a new gain setting so that the variable gain section may adapt to the new gain setting within one clock period. In one example, a gain range of 84 dB is controllable and settling is achieved within 3 clock periods at most.

34 Claims, 4 Drawing Sheets

OTHER PUBLICATIONS

"A Fully Integrated Broadband Direct-Conversion Receiver for DBS Applications", Jayaraman, et al, *2000 IEEE International Solid-State Circuits Conference*, IEEE, San Francisco, CA, Feb. 2000.

Stroet P M et al: "A zero-IF Single-Chip Transceiver for Up to 22 Mb/s QPSK 802.11b Wireless LAN", IEEE International Solid-State Circuits Conference, Feb. 5, 2001, pp. 204-447, XP010536238.

Jayaraman A et al: "A Fully Integrated Broadband Direct Conversion Receiver for DBS Appilcations", IEEE International Solid-State Circuits Conference, Feb. 7, 2000, pp. 140-141, XP010378831.

International search report application No. PCT/US03/06262 mailed Apr. 20, 2004.

\* cited by examiner

DIGITAL AUTOMATIC GAIN CONTROL FOR TRANSCEIVER DEVICES

FIELD OF THE INVENTION

The present invention relates to methods and apparatus used in wireless communication systems and particularly relates to the automatic gain controlling in transceiver devices used for the wireless data transfer, for example by wireless local area networks (WLAN), mobile phones and the like.

DESCRIPTION OF THE PRIOR ART

Currently great efforts are being made to develop transceiver devices offering a high degree of reliability at low cost. A key issue in this respect is the degree of integration with which a corresponding transceiver device may be manufactured. While for many applications, such as direct broadcast satellite (DBS) receivers and WLAN devices, this is of great importance due to cost effectiveness, in other applications such as mobile phones, mobile radio receivers and the like, low power consumption is of primary concern.

Presently, two major architectures for transceiver devices are competing on the market, wherein due to the higher degree of integration and the potential for reduction of power consumption, the so-called direct conversion architecture seems to become the preferred topography compared to the so-called super-heterodyne architecture. Super-heterodyne receivers down-convert the received radio frequency (RF) signal to a lower intermediate frequency (IF) signal that may be filtered, amplified or otherwise processed more conveniently. Although the super-heterodyne architecture is well established and allows the fabrication of reliably operating receiver devices, the highly selective IF filters that are necessary for the proper operation of these devices, require the employment of capacitors and inductors of high quality, thereby restricting the degree of integration achievable with a super-heterodyne architecture, since high quality inductors may not easily be implemented into a semiconductor substrate. Moreover, the amplifiers operating at the relatively high IF require relatively large drive currents to provide for the required gain factor so that the power consumption of these devices may not be reduced to the levels of amplifiers operating at relatively low frequencies.

In direct conversion receivers, the RF signal is directly down-converted to a DC level, i.e. the IF is zero, so that the required filters and amplifiers, except for a low noise amplifier and input filter, may operate at baseband frequencies. Thus, the required filters may be integrated into the chip bearing the all or most of the residual circuitry, while at the same time power consumption of the involved amplifiers is significantly lower than in the super-heterodyne architecture. Despite these advantages, direct conversion devices exhibit a serious draw back in that any offset drift, for example caused by a slight miss match of the local oscillator with respect to the incoming RF signal, may not easily be separated and is thus a part of the baseband signal.

Irrespective of the architecture used in obtaining the baseband signal, for proper operation receiver devices have to take account for signal strength variations of the RF signal that may be caused by environmental influences or by frequently changing the position of the receiver, as is in the case of mobile phones or portable computer devices. Moreover, in many applications it may be necessary to detect an RF signal burst to identify the start of a data transmission, wherein commonly the receiver sensitivity is at a maximum while searching for an RF burst. As soon as the RF burst is detected, however, the receiver gain has to be adjusted to the RF signal so as to generate an appropriate level of the baseband signal to accomplish a reliable data reception.

In "*A Zero-IF Single Chip Transceiver for up to 22Mb/sQPSK 802. 11B Wireless LAN*", by Peter M. Stroet, 2001 IEEE International Solid-State Circuits Conference, a 2.45 GHz wireless LAN transceiver with a direct conversion architecture for the IEEE802.11b standard that exhibits a high level of integration. This is accomplished by using only one external front end filter, one power amplifier, a baseband chip, one crystal and a battery, whereas the remaining components are included in a single chip. In principle, the chip contains a low noise amplifier (LAN) followed by a mixer and a tuneable filter unit. Subsequently, the signal is fed to a variable gain amplifier having 40 dB gain in 2 dB steps followed by an AC coupled driver circuit which has two gain settings, 1 dB apart. From the input of the driver circuit the signal is additionally supplied to a limiter and a received signal strength indicator circuit, a low pass filter and an ADC so as to allow a state machine to determine the signal strength. Since the QPSK signal does not have a constant envelope the received signal strength indicator level is difficult to estimate accurately. Thus, by taking both baseband signals, using a higher order low overshoot low pass filter at the received signal strength indicator and a reduced limiter/received signal strength indicator range of about 30 dB, the signal strength can be determined more accurately. Due to the reduced received signal strength indicator range the gain settling has to be done in at least three steps. After resetting the automatic gain control, performed in the state machine, it takes about 9 microseconds to determine the correct gain setting and an additional 5 microseconds to let the DC offset decay. Consequently, a relatively long settling time for a moderate dynamic range of the variable gain amplifier is required.

In "*A Fully Integrated Broadband Direct-Conversion Receiver for DBS Applications*", by Arun Jayaraman et al, 2000 IEEE International Solid-State Circuits Conference, a receiver chip is disclosed, the front end of which consists of a low noise variable gain attenuator followed by an I-Q mixer. The mixer output supplies the signal to a baseband section whose gain and bandwidth can be dynamically controlled. The baseband section includes variable gain amplifiers and tuneable filter elements, wherein the current steering variable gain amplifiers can produce a maximum baseband gain of 65 dB with more than 55 dB of gain control. The variable gain amplifiers have digital controls to set gain and offsets which allows for redistribution of baseband gain to accommodate different data rates. To prevent propagation of DC offsets due to leakage of the local oscillator and due to device miss matches, a continuous DC cancellation loop has to be provided around the first stage. In this receiver chip, however, the range of gain control is relatively moderate and the time period for the settling of the variable gain amplifiers is not specified.

It is thus important to improve the small-signal stability in the closed loop in automatic gain control in conjunction with a large dynamic range of the variable gain amplifiers used so that a transceiver may rapidly adapt to a wide dynamic range of RF signals.

SUMMARY OF THE INVENTION

Generally, the present invention provides devices and methods for digitally controlling the gain of IF signals within a large dynamic range, wherein the settling time of the variable gain amplifiers is small, so that, in particular, the settling may be completed within the preamble of a data packet to match the receiver and the transmitter substantially without data loss. The present invention allows an effective gain control within a few clock cycles by employing a minimum number of digital components, such as an adder and a latch so that the automatic gain control may easily be integrated in a single chip transceiver for direct conversion without unduly adding to design complexity.

In one embodiment an automatic gain control for transceiver devices comprises a variable gain amplifier section configured to output an amplified intermediate frequency signal and to vary a gain step-wise in a plurality of discrete gain settings in response to a control signal. The device firstly comprises a baseband rectifying section that is configured to provide, in synchronism with a clock signal, an output signal indicative of the amplified intermediate frequency signal. A comparator section is provided and is configured to compare the output signal with different plural reference voltages in synchronism with the clock signal. Moreover, a control section is provided and is configured to output the control signal in response to a comparator output signal provided by the comparator section.

According to a further embodiment, an automatic gain controller for an RF receiver comprises a signal input section that is adapted to receive an intermediate frequency signal from a variable gain amplifier and to provide a sample signal indicative of the intermediate frequency signal. The controller further includes a control output to output a gain setting signal to the variable gain amplifier. A comparative section is configured to provide a comparison result of the sample signal with a plurality of threshold voltages. A gain setting controller is provided and is configured to generate the gain setting signal from the comparator result with a first number of discrete gain settings in synchronism with a clock signal that is provided to the gain setting controller. The gain setting controller, in turn, includes an adder and a latch enabled by the clock signal and connected between an output and an input of the adder to from an accumulator.

In a further embodiment, a method of automatically controlling the gain of an input signal comprises providing a clock signal and generating a sample signal from the input signal synchronised with the clock signal, wherein the sample signal is indicative of an amplitude of the input signal. The method further comprises comparing the sample signal with a plurality of distinct threshold voltages and generating a bit pattern according to the comparison synchronised with the clock signal. Moreover, numbers representing the bit pattern are successively added and synchronised with the clock signal and an output signal is generated that is indicative of a discrete gain setting.

In a further illustrative embodiment an automatic gain controller for providing a gain setting signal for selecting one of a plurality of gain settings comprises a rectifying section configured to receive an input signal and to output a sample signal indicative of a signal amplitude of the input signal. A digitizing section is provided and configured to convert the sample signal into a digital number and an adder has an output, a first input to receive the digital number and a second input, wherein the adder has a count range corresponding to the plurality of gain settings. A latch has an input and an output, wherein the latch input is coupled to the adder output and the latch output is coupled to the second adder input. Additionally, the automatic gain controller comprises a decoder having an input coupled to the adder output and an output for providing the gain setting signal, wherein the digitizing section and the latch are operated in synchronism with a clock signal.

BRIEF DESCRIPTION OF THE DRAWINGS

Further advantages, objects and embodiments of the present invention are defined in the appended claims and will be become more apparent with the following detailed description when considered with reference to the accompanying drawings in, which:

FIG. 1b schematically shows a block diagram of a variation of the embodiment shown in FIG. 1a;

DETAILED DESCRIPTION OF THE INVENTION

It is to be noted that although the present invention is described with reference to the embodiments as illustrated in the following detailed description and in the accompanying drawings, the detailed description, as well as the drawings, are not intended to limit the present invention to the particular embodiment disclosed therein, but rather, the described embodiments merely exemplify the various aspects of the present invention, the scope of which is defined by the appended claims.

Figure 1A:
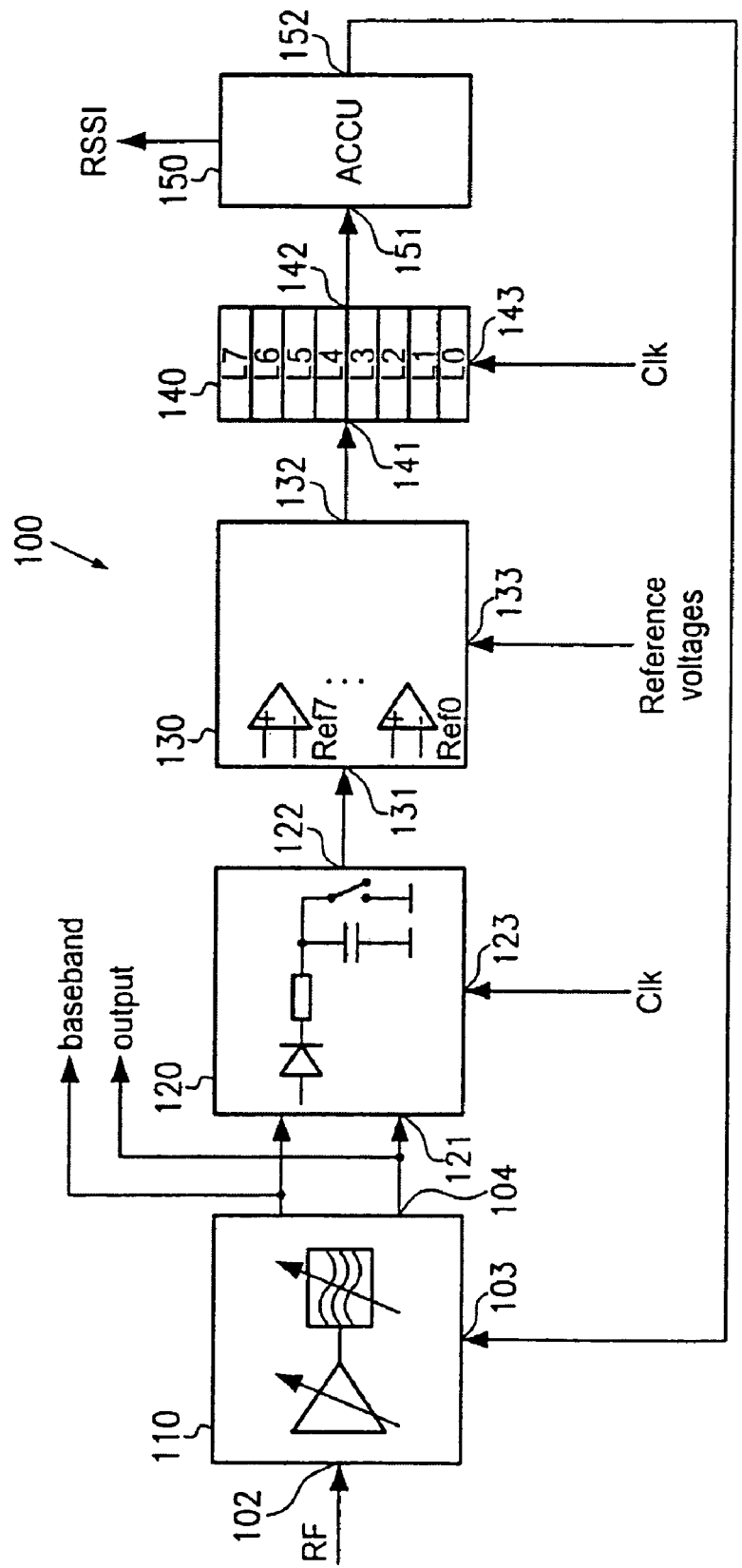
FIG. 1a schematically shows a block diagram of one embodiment of an automatic gain control.

With reference to FIG. 1a, one illustrative embodiment will now be described. A transceiver device 100 comprises a variable gain amplifier and filter section 110, henceforth referred to variable gain section, having an input 102 for receiving an RF signal, an input 103 for receiving a gain setting signal and an output 104 for supplying an IF signal, such as a baseband signal when a direct conversion architecture is used, to the variable gain section 110. The variable gain section 110 is followed by a rectifying section 120 having an input 121 for receiving the IF signal of the variable gain section 110, an output 122 to provide a signal indicative of the amplitude of the input IF signal, and in one particular embodiment, a clock input 123 for receiving a clock signal enabling operation of the rectifying section 120.

A comparator section 130 is operatively coupled between the rectifying section 120 and a latch 140. The comparator section 130 comprises an input 131 for receiving the output of the rectifying section 120 and an output 132 for providing a bit pattern indicative of the signal amplitude entered at the input 131. Moreover, an input 133 is provided so as to receive a plurality of different reference voltages that are internally connected to individual comparator elements in the comparator section 130. The latch 140 is connected with its input 141 to the comparator section 130 and is connected with its output 142 to an input 151 of a control section 150. Furthermore, the latch 140 comprises a clock signal input 143 to receive a clock signal generated by a clock generator that is not shown in FIG. 1a. An output 152 of the control section 150 is connected to the input 103 of the variable gain section 110.

Figure 2:
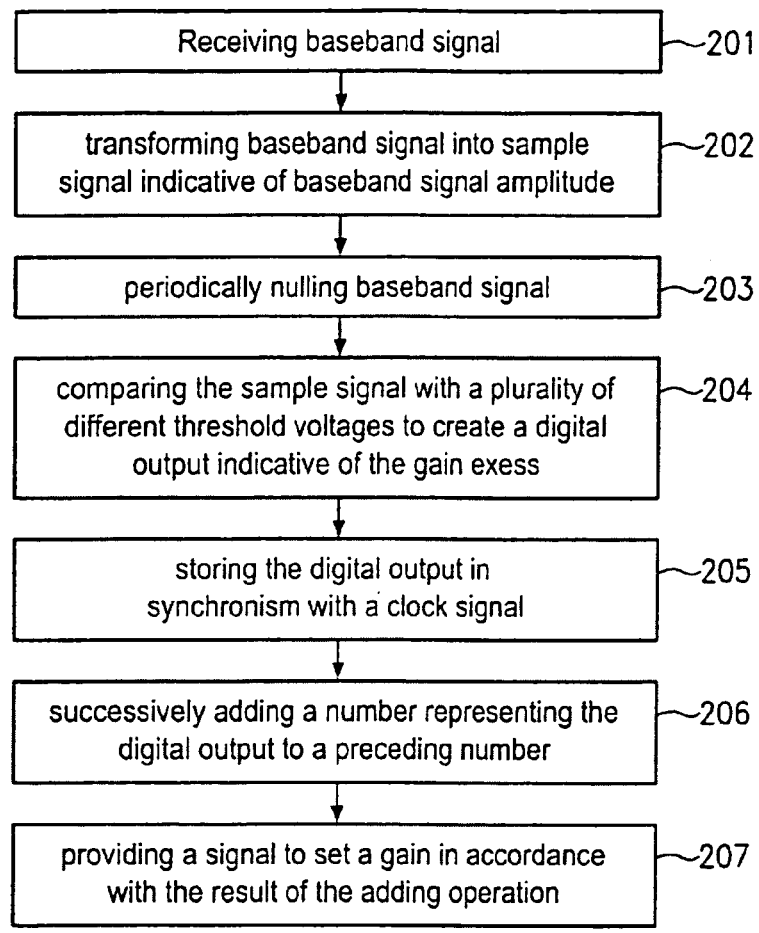
FIG. 2 shows a flow diagram depicting one illustrative embodiment of a method of automatically controlling the gain of a transceiver device.

The operation of the transceiver device 100 will be described with reference to FIGS. 1a and 2.

Firstly, an RF signal transmitted by, for example a WLAN, a TV satellite, or any other radio device, is received at input 102 and is processed by the variable gain section 110 so that an IF signal is obtained at the output 104. In case of a direct conversion topology in the variable gain section 110, the IF signal is provided as an in-phase and a quadrature baseband signal. At the output 104 the baseband signal is available for further processing and is concurrently supplied to the input 121 of the rectifying section 120 (step 201).

The signals received at the input 121 may be rectified and possibly smoothed to create a signal at the output 122 that is indicative of the amplitude of the baseband signals received at the input 121 (step 202).

In one embodiment, the clock signal may be received at the input 123, wherein the rectifying section 120 is periodically switched to a defined state to, for example discharge any capacitances that may be exist in the rectifying section 120. Otherwise, a large change of the signal at the input 121 may lead to a delayed response at the output 122 due to the RC time constant in the rectifying section 120. The signal supplied from the output 122 represents the amplitude of the baseband signals and is supplied to the comparator section 130, in which the signal is compared to a plurality of reference voltages supplied to the input 133.

In one particular embodiment, the reference voltages may differ from each other according to a logarithmic scale so that a bit pattern provided at the output 132 may indicate the gain excess on a logarithmic scale with respect to a predefined desired voltage. The comparator section 130 may be configured so as to provide a logic 1 and the bit pattern as soon as the signal crosses the corresponding reference voltage. It should be appreciated, however, that any other logic may be used in the comparator section 130 to create an appropriate bit pattern. Upon reception of the rising edge or the falling edge of the clock signal the bit pattern at the input 141 of the latch 140 is temporarily stored and is available at the output 142 (step 205).

The bit pattern stored in the latch 140 is supplied to the control section 150 in which the bit pattern may be transformed into a digital number representing the currently valid gain excess. This digital number is converted into a respective gain setting to which the variable gain section 110 is to be set so as to achieve or approach the required gain setting. The conversion of the digital number into the corresponding gain setting may be performed by successively adding the gain excess number to a number obtained at the preceding clock cycle (step 206).

Subsequently, a signal indicative of the gain setting is supplied to the variable gain section 110. In one embodiment, at least some of the reference voltages supplied to the comparator section 130 differ from each other by a minimal gain step of the variable gain section 110 to provide for a "fine" resolution. The gain setting of the variable gain section 110 may then be effected rapidly within one clock period, when the gain excess represented by the signal at the output 122 of the rectifying section 120 is within the range of these finely tuned reference voltages supplied to the input 133 of the comparator section 130. If the signal amplitude provided at the output 122, however, exceeds the highest one of the reference voltages, the gain setting of the variable gain section 110 may be reduced by a predefined amount. In one embodiment at least one reference voltage is selected so as to indicate a large gain excess, for example a gain excess of 36 dB, and the gain setting is reduced by this gain excess to accelerate gain reduction for large signal variations.

Figure 1B:
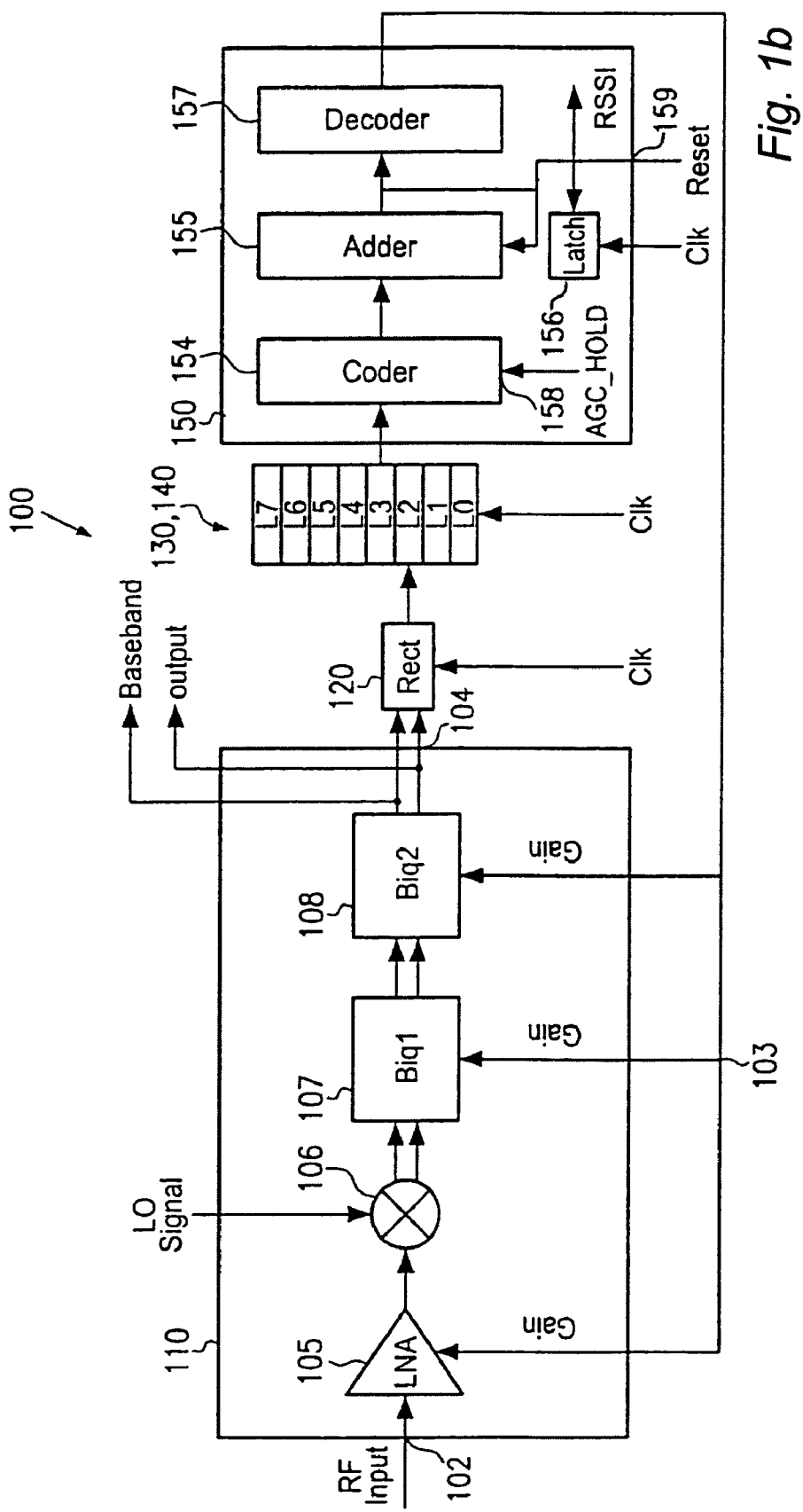

FIG 1b shows a more detailed variation of the embodiment of FIG. 1a. In FIG. 1b the same reference numbers are used for equivalent components and parts.

The transceiver device 100 comprises the variable gain section 110 including, at the input stage, a low noise amplifier (LNA) 105 followed by a mixer 106 that is configured to provide the in-phase signal and the quadrature signal upon reception of the IF signal of a local oscillator (not shown). Two base band filters 107 and 108, in the present example provided as Bi-quad filters form the final stage of the variable gain section 110. In the embodiment shown in FIG. 1b, the LNA 105, the first filter 107 and the second filter 108 are all adapted to receive a gain setting signal that may correspondingly adjust the gain of the corresponding stage so that the total gain of the variable gain section 110 is defined by the product of the individual gain settings. In this way, the arrangement allows the gain adjustment by switching binary weighted resistors so that the corresponding gain settings of the individual components 105, 107 and 108 leads to an addition in the logarithmic dB domain. In one particular embodiment, the gain of the variable gain section 110 may be adjusted according to 28 gain steps that are 3 dB separated so that in total 29 discrete gain settings are available. Accordingly, the available dynamic range is 84 dB.

In FIG. 1b, the control section 150 comprises a coder 154 that is connected to the comparator-latch section indicated as 130, 140, followed by an adder 155 including a latch 156 connected between the output and the input of the adder. The output of the adder 155 is also coupled to a decoder 157, the output of which is connected to the input 103 of the variable gain section 110. The adder 155 may comprise a reset input 159 to establish a defined state of the adder 155 upon receiving a reset signal. Moreover, the adder 155 is preferably adapted to show saturation characteristics, i.e. the adder 155 is, in one embodiment, configured so as to not count below zero and above 28, If a different number of gain settings is used, the adder 155 may appropriately be adapted to the corresponding number of gain settings in the variable gain section 110.

In operation, the variable gain section 110 receives an RF input signal at the input 102 which is amplified by the LNA 105 according to the presently valid gain setting. For convenience, it is assumed that the variable gain section 110 is currently searching for an RF signal and the total gain is adjusted to the maximum gain, which may, as in the embodiment described above, be 84 dB. The RF signal amplified by the LNA 105 as a first amplifier stage is supplied to the mixer 106 that is driven by the two phase shifted frequency signals of the local oscillator. The local oscillator is matched to the carrier frequency of the FR signal and the resulting baseband signals are filtered and amplified by the Bi-quad filters 107 and 108. The finally obtained baseband signal is available at the output 104 and is also supplied to the rectifying section 120 which, in synchronism with the clock signal, rectifies the baseband signal to produce a rectified signal or sample signal that is indicative of the signal amplitude of the baseband output. For example, during the high period of the clock signal, the output of the rectifying section 120 may be pulled to zero, as depicted in FIG. 1a, whereas during the low period of the clock signal, measurement of the rectified baseband signal takes place by means of the comparator-latch section 130, 140. Periodically pulling the outputs of the rectifying section 120 to zero substantially prevents the rectifying section 120 from rectifying DC step responses, and also substantially avoids a too slow decrease of the rectifying output signal due to the averaging RC time constant after large gain reductions have occurred. At the rising edge, or alternatively at the falling edge of the clock signal, the rectified output signal supplied to the comparator latches is temporarily stored in the latches and is available at the output of the comparator latch section 130, 140.

In an embodiment having a dynamic range of 84 dB, as described above, comparators and latches L0 to L7 may compare the rectified baseband signal with 8 different reference voltages to create a bit pattern indicative of the amplitude of the baseband signal and thus indicative of the presently valid gain excess of the variable gain section 110. For example, the reference voltage supplied to the comparator/latch L2 may represent the desired output voltage of the variable gain section 110 and may be indicated as the 0 dB bit. If, for instance, the desired output voltage is approximately 125 mV, the reference voltage of L2 may be selected to approximately 2.5 dB above 125 mV which corresponds to about 167 mV. The comparators/latches L3 to L5 may receive reference voltages that are each separated by 3 dB from the adjacent reference voltage. The comparator/latch L7 may receive a reference voltage indicating a signal amplitude exceeding 36 dB above the 0 dB signal level, while comparator/latch L6 may receive a reference voltage indicating a signal amplitude exceeding 24 dB. Preferably, the 36 dB level is selected to be below or at the saturation level of the variable gain section 110. When the RF input signal has a relatively large strength the rectifying section 120 may provide an output signal to the comparator/latch section 130, 140 that exceeds the reference voltage of L7 so that the coder 154 generates a digital number indicating a gain step that is appropriate for reducing the total gain by 36 dB. The digital number output from the coder 154 is supplied to the adder 155 and is added to the digital number provided by the latch 156 at the rising edge of the clock signal. Since it is assumed that the present gain setting is the maximum gain, i.e. 84 dB, the adder output temporarily stored in the latch 156 and provided to the adder input at the rising edge of the clock signal is zero so that, after the rising edge of the clock signal, the adder provides a number to the decoder 157 that indicates the new gain setting reduced by 36 dB. The decoder 157 provides a gain setting signal to the variable gain section 110 that is appropriate to adjust the total gain to be 36 dB below the previous setting, i.e. 84 dB minus 36 dB.

In the next measurement cycle of the rectifying section 120 the signal obtained by the newly set variable gain section 110 is again compared with the reference voltages of L2 to L7 and, in case the signal is now within the 12 dB range of L2 to L5, the total gain of the variable gain section 110 is set in this step so as to produce a baseband output that is approximately at the desired reference voltage of L2 corresponding to the 0 dB signal.

If the signal obtained by the newly set variable gain section 110 again exceeds the threshold of L7, the gain is again reduced by 36 dB and thus, according to the dynamic range of 84 dB, is after the next gain reduction step within the 12 dB range of L2–L5.

If the signal obtained by the newly set variable gain section 110 exceeds the threshold of L6, is, however, below the threshold of L7, the gain is again reduced by 24 dB and thus is after the next gain reduction step within the 12 dB range of L2–L5.

According to this embodiment, the gain reduction is designed in such a way that the residual receiver gain excess is zero or more, thereby allowing a monotonic settling behaviour of the gain adjustment of the variable gain section 110. Thus, any over- or under-shooting of the total gain is substantially avoided. Moreover, the gain settling is achieved in three steps at most. When the gain control is designed to mainly respond to RF bursts, instead of L6 and L7 the comparator latches L0 and L1 may be used for this purpose. Otherwise, the latches L0 and L1 may be used for increasing gain, as will be described in more detail below.

Figure 3:
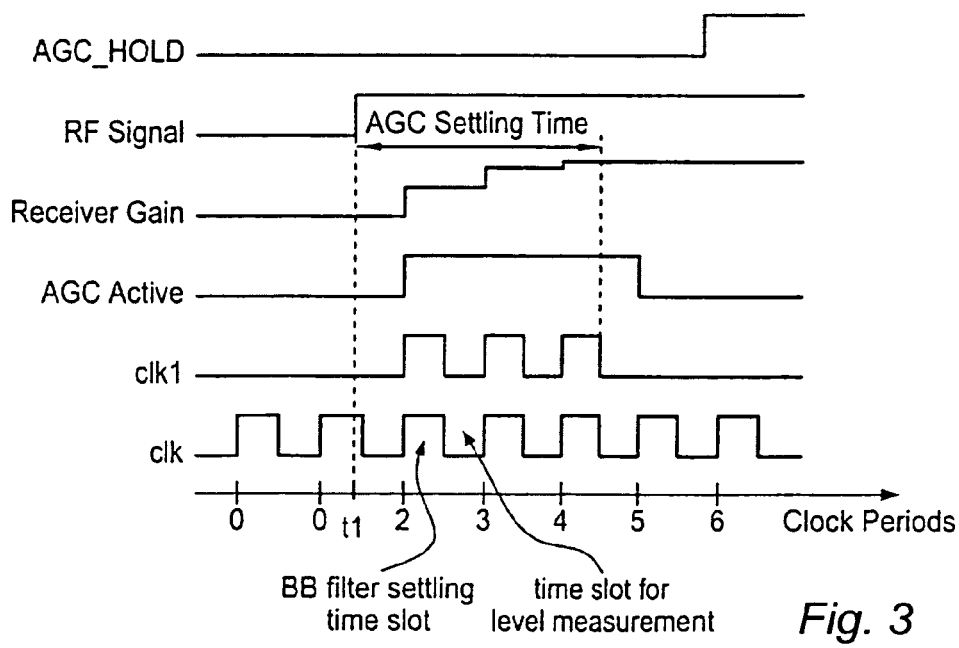
FIG. 3 schematically shows a timing diagram in which the time relationship between various components of the automatic gain cotroller is schematically depicted, when an input signal burst is received at the automatic gain controller.

With reference to FIG. 3, the operation of an illustrative embodiment of the automatic gain control is described by a corresponding time diagram for the case that the transceiver device 100 observes a specified radio channel for a potential RF signal, as is the case in a WLAN when a peripheral device is waiting for a data transmission. The embodiment for describing this event is configured as shown in FIG. 1b, wherein the clock frequency that is selected at 22 MHz/26 is equal to 846.153 KHz corresponding to a clock period of 1.1818 microseconds. 22 MHz represent the clock rate of the IEEE802.11B standard with 11 Megabits per second. The automatic gain control is designed to adjust the gain setting in three steps at most, so that the gain settling is completed well within the first 128 bits of the preamble of an according RF burst in compliance with the above-identified standard.

In FIG. 3, the horizontal axis is divided into discrete clock periods of the clock signal CLK. As previously explained, during the high period of the clock signal, the output of the rectifying section 120 may be pulled to zero and no measurement is performed. At a time point t1, an RF signal may be received at the input 102 and is amplified with a gain factor of 84 dB, since usually the transceiver device 100 is put to the maximum gain when observing a radio channel for a potential signal. At the following low level of the clock signal a sample signal is generated representing the amplitude of the baseband signal output by the variable gain section 110. During the rising edge of the clock signal, i.e. at the beginning of clock period 2, the signal at the output of the rectifying section 120 is compared with the reference voltages, and for a relatively large RF signal, the comparator/latch L7 indicates that the gain excess exceeds 36 dB so that the decoder 157 provides a gain setting signal causing the variable gain setting 110 to reduce gain by 36 dB. In the following high level of the clock signal, the output of the rectifying section 120 are pulled to zero and the variable gain section 110 may settle to the new gain setting of 48 dB. During the next low level of the clock signal the baseband signal amplified according to the newly adjusted gain setting is rectified and supplied to the comparator/latch section 130, 140. During the next rising edge of the clock signal, i.e. at the beginning of clock period 3, the comparator result is stored and is also provided to the control section 150 in which the gain setting signal for the new gain setting is generated. It is assumed that the signal supplied to the comparator section is still above the 12 dB range covered by L2–L5, and is also above the reference voltage of L6, but is below the reference voltage of L7, i.e. the gain excess exceeds 24 dB but is below 36 dB. Thus according to the newly obtained gain setting signal, the gain is reduced by 24 dB. In the following high level of the clock signal, the output of rectifying section 120 is pulled to zero and the variable gain section 110 settles at a gain of 24 dB.

It is thus ensured that the signal level obtained after the third measurement cycle is well within the zero and 12 dB range so that the final gain adjustment is obtained in the third clock period after the occurrence of the RF burst. Moreover, the latches L0, L1 may be set to about −3 dB and −12 dB, respectively, to provide for gain increase when the signal varies only slowly after gain adaptation to the RF burst. The embodiments described above therefore represent a compromise between the number of reference voltages to be provided and the number of clock periods required for settlement of the gain setting. In the above described embodiment it is ensured that, with a provision of 8 reference voltages, the gain settling is obtained within 3 clock periods over the entire dynamic range of 84 dB well within the preamble of the above-identified IEEE 802.11b standard. Thereby it is assumed that the 0 dB reference voltage is selected so that any potential RF signal does not exceed the 0 dB reference voltage at a gain setting corresponding to 0 dB which would mean that the desired baseband signal amplitude would be obtained without amplification.

In a further embodiment, the clock signal supplied to the rectifying section 120 and the latch 156 may be delayed with respect to the clock signal supplied to the latch 140 so as to ensure that the latch stores the comparison results before the outputs of the rectifying section 120 are pulled to zero.

In one embodiment, in the mode of observing a radio channel for potential RF bursts, the clock signal supplied to the latch 140 may be gated, so that only 3 subsequent clock periods are supplied to the latch 140, thereby significantly reducing the risk of filter switching due to any erroneous measurement activities. A corresponding filter switching could otherwise inappropriately distort the received signal. In FIG. 3 the gated clock signal is indicated as clk1, Moreover, according to a further illustrative embodiment, the automatic gain control may be set on hold by a respective enable signal supplied for example to the coder 154. As previously described, a reset signal supplied at input 159 may reset the adder to a defined state, such as a zero state. Furthermore, the output of the adder may be used as a received signal strength indicator.

Figure 4A:
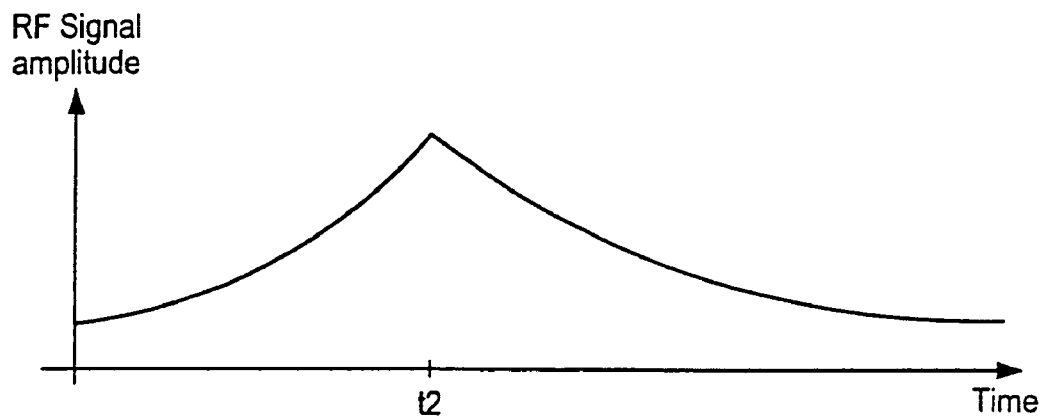
FIG. 4 schematically shows a time diagram depicting the effect of one illustrative embodiment, when a slowly increasing or decreasing signal is received.
Figure 4B:
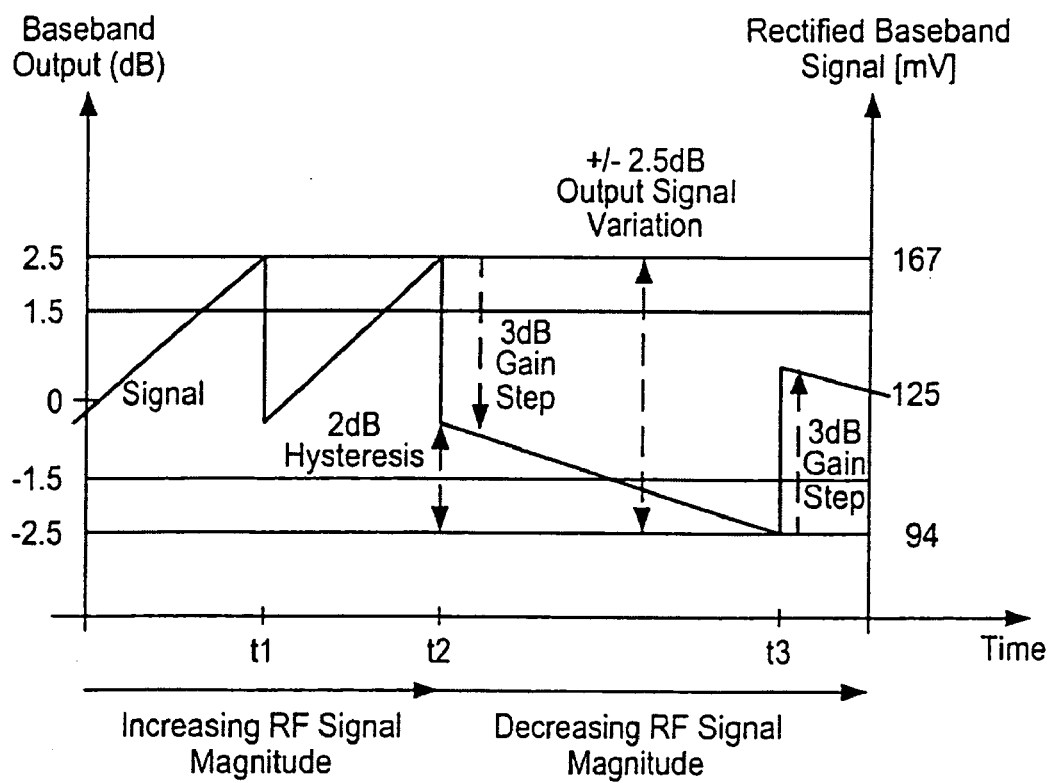

With reference to FIGS. 4a and 4b, the operation of the embodiments illustrated in FIG. 1b will now be described, wherein the automatic gain control is accomplished for a relatively slowly increasing or decreasing input signal.

FIG. 4a shows a diagram, wherein the horizontal axis indicates the time and the vertical axis represents the signal amplitude of an incoming RF signal. It is assumed that the received RF signal monotonically increase up to a time point t2, at which the RF signal then continuously decreases, for example, due to a change of the position of the transceiver, or the like.

In FIG. 4b, the corresponding rectified signal amplitude measured during the low levels of the clock signal and obtained at the output of the rectifying section 120 is illustrated with respect to the dB domain (left hand axis) and the corresponding linear scale calibrated in mV (right hand axis). It is assumed that, at time below t0 corresponding to the origin of the time axis, the rectified signal amplitude is approximately at the desired signal amplitude of 0 dB or of 125 mV. At t0 the RF signal and thus the rectified signal amplitude rises and reaches at time point t1 the reference voltage of the comparator L2 of 2.5 dB or 167 mV. Accordingly, the automatic gain control reduces the gain within one clock period by 3 dB so that the rectified signal amplitude after t1 is approximately −0.5 dB. From t1 to t2, the RF signal amplitude still increases and thus the rectified signal amplitude increases, starting from −0.5 dB, and reaches at time point t2 again the 2.5 dB reference voltage of the comparator L2. Consequently, the gain is reduced again by 3 dB within one clock period so that the rectified signal amplitude is again at −0.5 dB.

At time point t2 the RF signal amplitude decreases, for example due to any environmental influences or the like and For this cases increasing the gain of the variable gain section 110 is required. In the embodiment of FIG. 1b the comparator reference voltage of L1 may be adjusted to −2.5 dB, whereas the reference voltage of L0 may be adjusted to −12 dB. It should be noted, however, that any other number of reference voltages may be provided if desired.

At time point t3, the rectified signal amplitude reaches the −2.5 db reference voltage of the comparator L1 and consequently, the automatic gain control increases the gain by 3 dB within one clock period. Consequently, the rectified signal amplitude will rise to 0.5 dB according to the new gain setting. Consequently, in the above embodiment, the variation of the rectified signal amplitude and thus the variation of the baseband signal is within the range of +/−2.5 dB. It should be noted, however, that any other appropriate small signal variation may be obtained by correspondingly selecting the reference voltages and the gain steps. Moreover, in the example described above, a 2 dB hysteresis is obtained as indicated in FIG. 4b. Generally, output signal variation is determined by the gain step size and the hysteresis by the following equation: output variation=+/−½× (gain step size+hysteresis).

For a rapidly decreasing RF input signal that is, for example, indicated by a rectified signal amplitude below the reference voltage of L0, the automatic gain control increases gain by 12 dB. Since for a desired output voltage of about 125 mV, typically a DC offset of about +/−10 mV has to be tolerated, it may be difficult to detect lower levels of the rectified signal amplitude as 10 mV already represent a signal level that is about 28 dB below the nominal output voltage.

In conclusion, an automatic gain control is provided that allows rapid gain settling even within the preamble of data packets coded according to the IEEE 802.11B standard, in that a digital closed loop is established, which is broken only by the latches provided to temporarily store a bit pattern representative of the baseband signal. After updating the latch contents, the digital signals may travel synchronously through a coder, an adder and a decoder to effect a new gain setting. The adder includes a latch as a feedback element so as to form an accumulator with saturation behaviour. For maximum gain, the accumulator state is zero. In the steady state of the automatic gain control, the coder output is zero and the adder output remains constant.

According to one embodiment, a fully controllable dynamic range of 84 dB is obtained with 29 gain settings separated by 3 dB, wherein a maximum settling time of the automatic gain control may be set to a predefined number of clock periods.

Although specific embodiments are described referring to a dynamic range of 84 dB any other desired range may be selected. By reducing the dynamic range the gain settling may be accelerated or the step size may be reduced. Moreover, the clock frequency may be selected in accordance with design requirements as long as is ensured that the gain settling and measurement of the baseband signal are completed within one half of a clock period.

Further modifications and variations of the present invention will be apparent to those skilled in the art in view of this description. Accordingly, the description is to be construed as illustrative only and is for the purpose of teaching those skilled in the art, the general manner of carrying out the present invention.

The invention claimed is:

1. An automatic gain control for a transceiver device, comprising:
a variable gain section configured to output an amplified intermediate frequency signal and to vary a gain step wise in a plurality of discrete gain settings in response to a control signal;
an intermediate frequency rectifying section configured to provide, in synchronism with a clock signal, an analog sample signal indicative of the amplified intermediate frequency signal;
a comparator section configured to concurrently compare said analog sample signal with plural different reference voltages in synchronism with said clock signal; and
a control section configured to output said control signal in response to a comparator output signal provided by said comparator section.

2. The automatic gain control of claim 1, wherein said control section comprises an accumulator including an adder having an input and an output, and a memory device connected between said input and said output for temporarily storing the output of said adder in synchronism with said clock signal.

3. The automatic gain control of claim 2, wherein said accumulator is adapted to have saturation characteristics with respect to said plurality of discrete gain settings.

4. The automatic gain control of claim 3, wherein the control section further comprises a coder for converting said comparator output signal into a digital number.

5. The automatic gain control of claim 4, wherein the control section further comprises a decoder configured to convert the output of said adder into said control signal.

6. The automatic gain control of claim 1, configured to achieve gain settling within a predefined number of clock periods.

7. The automatic gain control of claim 1, wherein the comparator section includes a memory element for temporarily storing the comparator results and outputting the results in synchronism with said clock signal.

8. The automatic gain control of claim 6, wherein the adjacent gain settings differ from each other by approximately 3 dB.

9. The automatic gain control of claim 1, wherein said variable gain section is configured to output a baseband signal.

10. The automatic gain control of claim 1, wherein said variable gain section includes a low noise amplifier having a variable gain for receiving a radio frequency signal and a filter unit having variable gain.

11. The automatic gain control of claim 10, wherein said filter unit comprises at least one Bi-quad filter.

12. The automatic gain control of claim 1, wherein the intermediate frequency rectifying section is configured to periodically pull an output thereof to a predefined reference voltage.

13. The automatic gain control of claim 1, wherein the control section comprises an output for supplying a signal indicating a radio signal strength of a radio frequency signal supplied to the variable gain section.

14. An automatic gain controller for a radio frequency receiver, comprising:
a signal input section adapted to receive an intermediate frequency signal and to provide an analog sample signal indicative of an amplitude of the intermediate frequency signal;
a control output to output a gain setting signal;
a comparator section configured to concurrently compare said analog sample signal and a plurality of distinct threshold voltages, each of said threshold voltages supplied to a respective one of a plurality of individual comparator elements; and
a gain setting controller configured to provide said gain setting signal from said comparator result with a first number of discrete gain settings in synchronism with a clock signal provided to the gain setting controller, wherein the gain setting controller includes an adder and a latch enabled by said clock signal and connected between an output and an input of said adder so as to form an accumulator.

15. The automatic gain controller of claim 14, wherein said signal input section comprises a rectifying section actuable in synchronism with said clock signal.

16. The automatic gain controller of claim 15, wherein said comparator section further comprises a latch to temporarily store a bit pattern representing said comparison result.

17. The automatic gain controller of claim 14, wherein a value range of said adder corresponds to the number of discrete gain settings.

18. The automatic gain controller of claim 14, wherein some of the plurality of threshold voltages cover a predefined dynamic range with a step size of approximately 3 dB.

19. The automatic gain controller of claim 14, wherein said predefined dynamic range is approximately 12 dB.

20. A method of automatically controlling gain of an input signal, the method comprising:
providing a clock signal;
generating an analog sample signal from said input signal in synchronism with said clock signal, the analog sample signal being indicative of an amplitude of the input signal;
concurrently comparing said analog sample signal with a plurality of distinct threshold voltages in synchronism with the clock signal;
generating a bit pattern from said comparison in synchronism with the clock signal;
providing a number representing said bit pattern to a first input of an adder;
providing a number representing the bit pattern of a previously obtained analog sample signal to a second input of said adder in synchronism with said clock signal; and
generating a gain setting signal from an output of said adder, wherein said gain setting signal is adapted to control the gain of a variable gain amplifier section.

21. The method of claim 20, further comprising detecting said input signal and providing, upon detection of said input signal, a predefined number of clock cycles of a second clock signal as said clock signal.

22. The method of claim 20, wherein generating an analog sample signal includes measuring said input signal during one half period of said clock signal.

23. The method of claim 20, wherein said adder has a count range that corresponds to a predefined number of gain settings.

24. The method of claim 20, wherein comparing said analog sample signal is carried out at one of a rising edge and a falling edge of said clock signal.

25. The method of claim 20, further comprising pulling said analog sample signal to a reference voltage after comparing said analog sample signal to the plurality of threshold voltages.

26. The method of claim 20, wherein a number at the output of said adder is temporarily stored in a latch coupled between the output and the second input of the adder.

27. The method of claim 26, wherein the latch is enabled in synchronism with said clock signal.

28. An automatic gain controller for providing a gain setting signal for selecting one of a plurality of gain settings, comprising:
- a rectifying section configured to receive an input signal and to output an analog sample signal indicative of a signal amplitude of the input signal;
- a digitizing section configured to convert said analog sample signal into a digital number;
- an adder having an output, a first input to receive said digital number and a second input, said adder having a count range corresponding to said plurality of gain settings;
- a latch having an input and an output, the latch input coupled to the adder output, the latch output coupled to the second adder input; and
- a decoder having an input coupled to the adder output and an output for providing said gain setting signal;
- wherein said digitising section and said latch are operated in synchronism with a clock signal.

29. The automatic gain controller of claim 28, wherein said digitising section comprises a rectifying section and a comparator section coupled to plural different threshold voltages.

30. The automatic gain controller of claim 29, wherein said comparator section includes a latch for temporarily storing a bit pattern representing an output signal of the comparator section.

31. The automatic gain controller of claim 30, wherein the digitising section further comprises a coder configured to convert said bit pattern into said digital number.

32. The automatic gain controller of claim 29, wherein said rectifying section is configured to pull an output thereof to a defined reference voltage.

33. The automatic gain controller of claim 32, wherein said output of the rectifying section is pulled to the reference voltage in synchronism with said clock signal.

34. The automatic gain controller of claim 28, configured to accept a predefined clock period of said clock signal.

* * * * *